United States Patent
Cheng (10) Patent No.: US 11,518,578 B2
(45) Date of Patent: Dec. 6, 2022

(54) PACKAGE STRUCTURE

(71) Applicants: HKC CORPORATION LIMITED, Guangdong (CN); CHONGQING HKC OPTOELECTRONICS TECHNOLOGY CO., LTD., Chongqing (CN)

(72) Inventor: Jia-He Cheng, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 170 days.

(21) Appl. No.: 16/641,038

(22) PCT Filed: Dec. 13, 2017

(86) PCT No.: PCT/CN2017/115899
§ 371 (c)(1),
(2) Date: Feb. 21, 2020

(87) PCT Pub. No.: WO2019/037343
PCT Pub. Date: Feb. 28, 2019

(65) Prior Publication Data
US 2021/0039834 A1  Feb. 11, 2021

(30) Foreign Application Priority Data
Aug. 24, 2017 (CN) .......................... 201710734617.X (51) Int. Cl.
*B65D 25/10* (2006.01)
*B65D 81/05* (2006.01)
(Continued)

(52) U.S. Cl.
CPC ......... *B65D 25/103* (2013.01); *B65D 81/057* (2013.01); *B65D 81/113* (2013.01);
(Continued)

(58) Field of Classification Search
CPC .. B65D 25/103; B65D 81/057; B65D 81/113; B65D 85/48; H01L 21/6734
(Continued)

(56) References Cited

U.S. PATENT DOCUMENTS 8,602,241 B1 * 12/2013 Kuo ....................... B65D 85/48
220/4.28
2001/0015332 A1 * 8/2001 Flynn .................. B65D 81/113
206/523
(Continued)

FOREIGN PATENT DOCUMENTS

CN    201301078 Y    9/2009
CN    102910380 A    2/2013
(Continued)

*Primary Examiner* — Steven A. Reynolds
(74) *Attorney, Agent, or Firm* — Muncy, Geissler, Olds & Lowe, P.C.

(57) ABSTRACT

A package structure comprises a backing plate supporting a target object, at least one pad disposed on the backing plate and fixing the target object, a frame disposed on a lower side of the backing plate, bonded to the backing plate, and supporting the backing plate to fix the pad onto the backing plate, and a side enclosing plate disposed around the backing plate and connected to the pad to fix the pad. The package structure further comprises a magnetic component disposed on the backing plate and attracting a magnetic coating on the target object.

5 Claims, 8 Drawing Sheets

(51) Int. Cl.
*B65D 81/113* (2006.01)
*B65D 85/48* (2006.01)
*H01F 7/02* (2006.01)
*H01L 21/673* (2006.01)

(52) U.S. Cl.
CPC .............. *B65D 85/48* (2013.01); *H01F 7/02* (2013.01); *H01L 21/6734* (2013.01)

(58) Field of Classification Search
USPC ........................................ 206/453, 521, 454
See application file for complete search history.

(56) References Cited

U.S. PATENT DOCUMENTS

2010/0213088 A1  8/2010  Goda
2016/0064993 A1* 3/2016  Fetterman ............. H02J 7/0042
                                                          320/137

FOREIGN PATENT DOCUMENTS

| CN | 102951377 A | 3/2013 |
| CN | 103043321 A | 4/2013 |
| CN | 107399496 A | 11/2017 |
| CN | 207174312 U | 4/2018 |

* cited by examiner

PACKAGE STRUCTURE

BACKGROUND

Technical Field

This disclosure relates to a technical field of a package apparatus, and more particularly to a package structure.

Related Art

When the existing liquid crystal glass panel is being shipped and packaged, an EPO (Expanded Polyolefin) or EPP (Expanded polypropylene) box is usually used. The EPO/EPP box is made of a foaming material and has the better buffer property but the lower structural strength than those of the metallic and plastic materials. The product tends to be damaged due to the deformation of the box in the packaging and transporting processes.

SUMMARY

An objective of this disclosure is to provide a package structure to solve the problem that the package structure tends to be damaged due to the deformation of the box in the packaging and transporting processes.

To achieve the above objective, the technical solution of this disclosure is to provide a package structure, comprising a backing plate, at least one pad, a frame, and a side enclosing plate. The backing plate supports a target object. The pad is disposed on the backing plate and fixes the target object. The frame is disposed on a lower side of the backing plate and bonded to the backing plate, and supports the backing plate to fix the pad onto the backing plate. The side enclosing plate is disposed around the backing plate and connected to the pad to fix the pad.

In one embodiment, the package structure further comprises a magnetic component disposed on the backing plate and attracting a magnetic coating on the target object.

In one embodiment, the magnetic component is a magnetic coating or a magnetic insert.

In one embodiment, an end portion of the frame is provided with a fixing structure connected to the pad to fix the pad.

In one embodiment, the fixing structure comprises a snap disposed on the frame, and a slot snapping with the snap is provided on the pad.

In one embodiment, the fixing structure is an expansion nail for connecting the frame to the pad, and the pad is provided with a mounting slot for accommodating the expansion nail.

In one embodiment, the expansion nail further comprises a sleeve, a sliding bar and a driving unit. The sliding bar is disposed inside the sleeve and slidably fit with the sleeve. The driving unit drives the sliding bar to slide along an axis of the sleeve. The driving unit is disposed on one end of the sliding bar, and a tapered boss for expanding the sleeve is disposed on the other end of the sliding bar.

In one embodiment, the driving unit comprises a drive ring and a restricting boss. The drive ring is threadingly connected to the sliding bar, and the restricting boss is disposed on an end portion of the sleeve, and rests against and fit with the drive ring.

In one embodiment, the driving unit comprises a first drive inclined surface, drive slider, and a pressing ring. The first drive inclined surface is disposed on the sliding bar. The drive slider rests against the first drive inclined surface for driving the sliding bar to slide. The pressing ring rests against the driving slider for driving the drive slider to slide. A second drive inclined surface is disposed on the pressing ring for driving the drive slider to move, an accommodating slot is formed on an end portion of the sleeve for accommodating the drive slider and the pressing ring, the pressing ring is slidably connected to a side surface of the accommodating slot, and the drive slider is slidably connected to a bottom surface of the accommodating slot.

In one embodiment, the fixing structure comprises a boss disposed on the frame, and a slot engaging with the boss is provided on the pad.

In one embodiment, a buffer pad is disposed on the backing plate, and the buffer pad is located between the backing plate and the target object.

In one embodiment, the side enclosing plate is inserted into and fixed to the pad.

In one embodiment, the frame is a metal frame.

The disclosure further provides a package structure for accommodating a target object. The package structure comprises a backing plate, at least one pad, a frame, a side enclosing plate, a magnetic component, and a fixing structure. The backing plate supports the target object. The pad is disposed on the backing plate and fixes the target object. The frame is disposed on a lower side of the backing plate and bonded to the backing plate, and supports the backing plate to fix the pad onto the backing plate. The side enclosing plate is disposed around the backing plate and connected to the pad to fix the pad. The magnetic component is disposed on the backing plate and attracting a magnetic coating on the target object. The fixing structure is disposed at an end portion of the frame and connected to the pad to fix the pad. The package structure comprises a snap and a slot. The snap is disposed on the frame, and the slot is disposed on the pad and snapping with the snap.

In the package structure provided by this disclosure, the pads are disposed at the corners of the backing plate and for fixing the target object. The fixing is stable. The frame is disposed on the lower side of the backing plate. Not only the strength of the backing plate can be improved, but also the pad can be firmly fixed to the backing plate to provide the buffer and support effects and ensure that the package structure in the transporting process cannot easily deform, has the high strength, and will not damage the internal target object. The side enclosing plate is disposed around the backing plate and for enclosing the circumference of the package structure. The side enclosing plate is connected to the pad. The mounting strength of the pad can be improved. The side enclosing plate, the backing plate and the pad and the frame constitute a frame structure. The structural strength of the package structure can be improved, so that the stability of the package structure in the transporting process can be greatly improved, and the problem that the target object is damaged in the packaging and transporting processes can be effectively solved.

DETAILED DESCRIPTION OF THE INVENTION

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, when a first component is "fixed to" or "disposed on" a second component, the first component can be directly or indirectly fixed to or disposed on the second component. When a first component is "connected to" a second component, the first component can be directly or indirectly connected to the second component.

In the description of this disclosure, it is to be understood that the terms "center", "transversal", "up," "down," "left," "right," "vertical", "horizontal", "top," "bottom," "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure.

In addition, the terms "first," and "second" are used for the illustrative purpose only and cannot be understood as indicating or implying the relative importance or implicitly specifying the number of indicated technical features. Therefore, the features restricted by "first" and "second" may expressly or implicitly comprise one or multiple ones of the features. In the description of this disclosure, unless otherwise described, the meaning of "multiple" comprises two or more than two. In addition, the terms "comprises" and any modification thereof intend to cover the non-exclusive inclusions.

Figure 1:
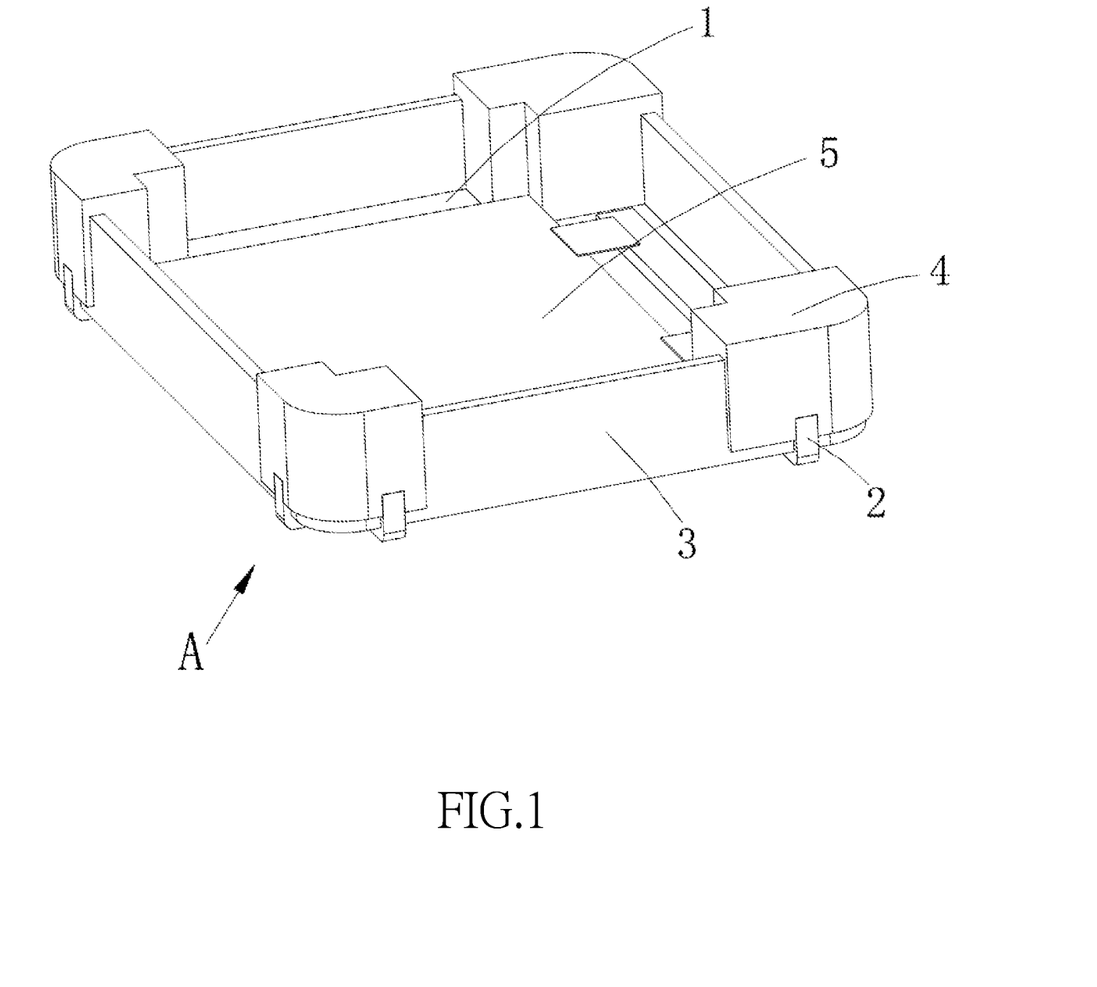
FIG. 1 is first schematic structure view showing a package structure provided by an embodiment of this disclosure.
Figure 2:
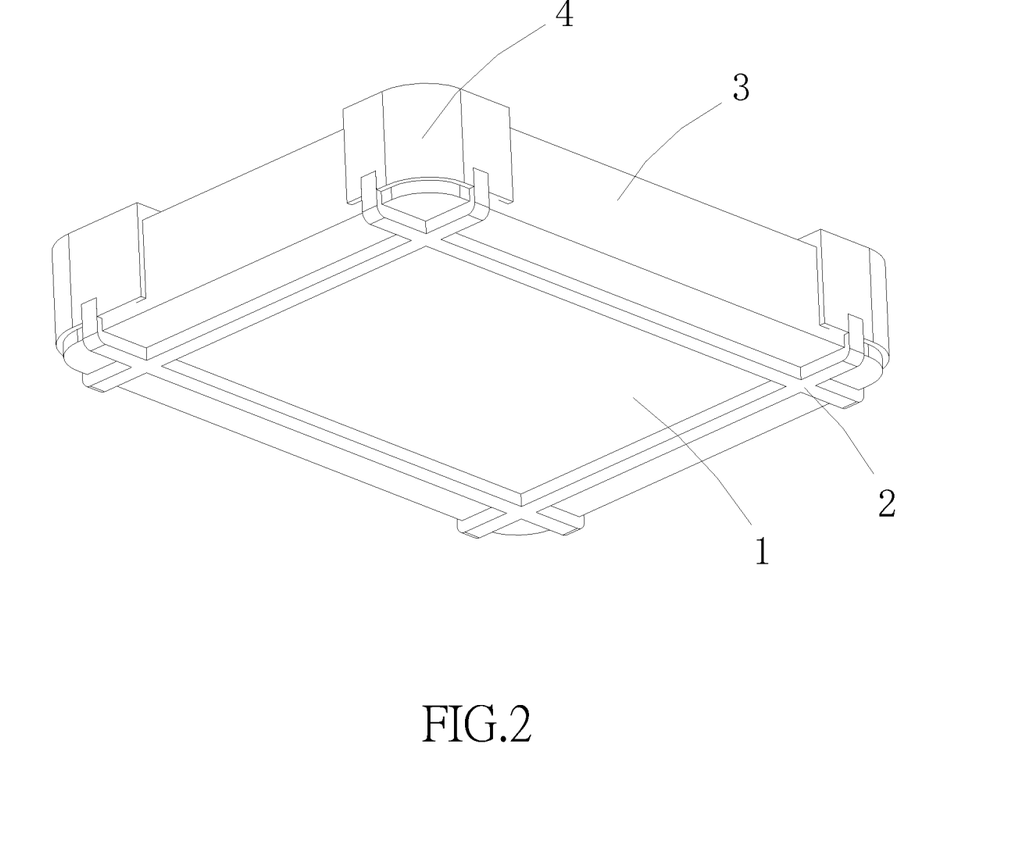
FIG. 2 is a schematic structure view taken along a direction A of FIG. 1.
Figure 3:
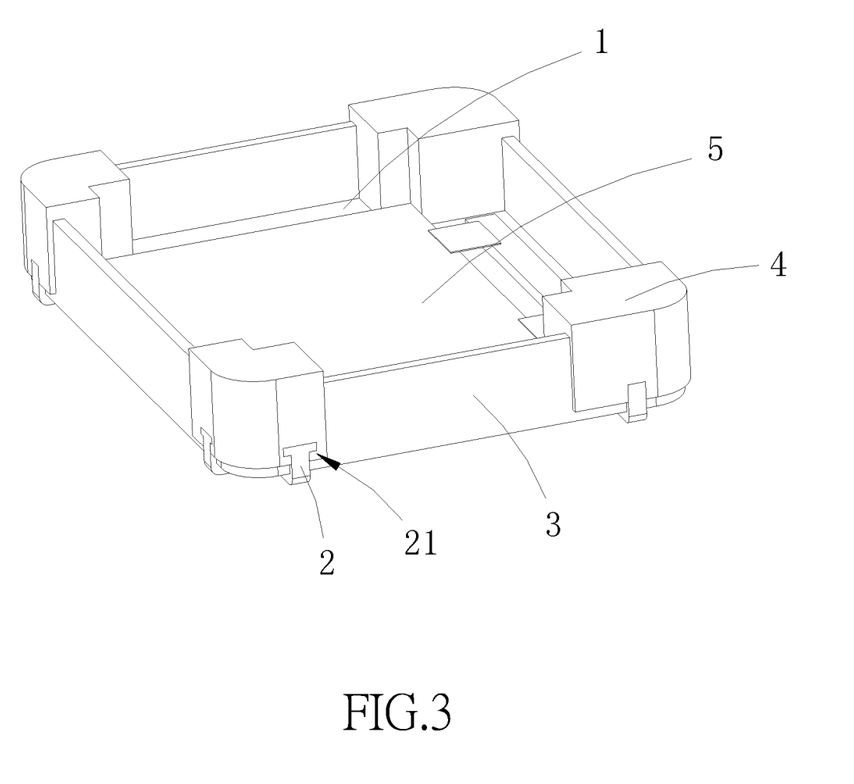
FIG. 3 is a second schematic structure view showing the package structure provided by the embodiment of this disclosure.

Referring to FIGS. 1 to 3, a package structure provided by this disclosure will be described now. The package structure includes: a backing plate 1 for supporting a target object 5; a pad 4 disposed on the backing plate 1 and for fixing the target object 5; a frame 2 disposed on a lower side of the backing plate 1 and bonded to the backing plate 1 and for supporting the backing plate 1 to fix the pad 4 onto the backing plate 1; and a side enclosing plate 3 disposed around the backing plate 1 and connected to the pad 4 to fix the pad 4.

In the package structure provided by this disclosure, the pads 4 are disposed at the corners of the backing plate 1 and for fixing the target object 5. The fixing is stable. The frame 2 is disposed on the lower side of the backing plate 1. Not only the strength of the backing plate 1 can be improved, but also the pad 4 can be firmly fixed to the backing plate 1 to provide the buffer and support effects and ensure that the package structure in the transporting process cannot easily deform, has the high strength, and will not damage the internal target object 5. The side enclosing plate 3 is disposed around the backing plate 1 and for enclosing the circumference of the package structure. The side enclosing plate 3 is connected to the pad 4, and the mounting strength of the pad 4 can be improved. The side enclosing plate 3, the backing plate 1 and the pad 4 and the frame 2 constitute a frame structure. The structural strength of the package structure can be improved, so that the stability of the package structure in the transporting process can be greatly improved, and the problem that the target object 5 is damaged in the packaging and transporting processes can be effectively solved.

In an embodiment, the target object can be fragile articles, such as a liquid crystal panel, a liquid crystal display, a liquid crystal glass panel, an ordinary glass plate, an OLED, an QLED, a ceramic and the like, and can be other easily damaged craft items and precious articles, such as an electronic electric apparatus, a meter instrument and the like.

In one embodiment, the side enclosing plate 3 and the backing plate are hollow plates, a layer of hollow plate is attached to a top surface of the frame 2 to serve as a plane support and surround the circumference of the box, and the hollow plate provides a buffer function. The pad 4 is made of a foaming material, and is optionally an EPP pad. Optionally, a buffer pad is disposed on the backing plate 1, and the buffer pad is located between the backing plate 1 and the target object 5 to effectively buffer an external force, and prevent bumping in the transporting process from damaging the target object 5. In addition, different materials and structures are used according to different positions of the package structure, and this ensures the packaging protection performance of the product and maximizes the reduction of the packaging costs. The optional frame 2 is the metal frame 2, which is formed by metal stamping and welding and provides the sufficient support strength for the package structure. Expanded polypropylene (EPP) is a plastic foaming material. Expanded polyolefin (EPO) hydrocarbon foaming copolymer consists of 30% polyethylene and 70% polystyrene.

In one embodiment, the corner pads 4 made of the EPP material can be provided with and positioned according to multiple models of machines to achieve multiple the sharing between the machines, and decrease the development cost and the time course.

In one embodiment, a package structure provided by this disclosure according to a specific implementation method also includes a magnetic component, which is disposed on the backing plate 1 and attracts the magnetic coating on the fixed target object 5. The magnetic material is coated on the target object 5, and on the backing plate 1 at the bottom is also correspondingly coated with the magnetic material or embedded with a magnetic pole that attracts the magnetic material on the target object 5. After the target object 5 is placed in an aligned manner, the backing plate 1 and the target object 5 are fixed through the magnetic attraction. Optionally, the target object 5 is a liquid crystal glass panel.

In one embodiment, in order to prevent the liquid crystal glass from impacting and damaging the backing plate 1, a thin soft glue may be attached between the backing plate 1 and the liquid crystal glass to provide the buffer function.

In one embodiment, as a specific aspect of the package structure of the disclosure, the magnetic component is a magnetic coating or a magnetic insert.

In one embodiment, referring to FIGS. 3 to 12, as a specific aspect of the package structure of the disclosure, an end portion of the frame 2 is provided with a fixing structure 21 connected to the pad 4 to fix the pad 4. The pad 4 can be firmly fixed and connected to the frame 2 by the provision of the fixing structure 21, so that the connection strength between the frame 2 and the pad 4 is better and the use effect is good.

Figure 4:
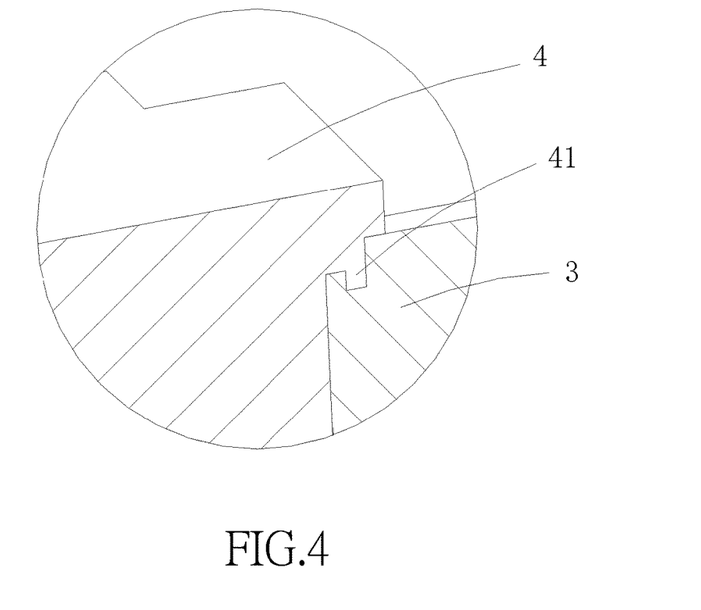
FIG. 4 is a schematic view showing a connection structure of a side enclosing plate and a pad used in the embodiment of this disclosure.

In one embodiment, referring to FIG. 4, as a specific aspect of the package structure of the disclosure, the side enclosing plate 3 is inserted into and fixed to the pad 4, the pad 4 is provided with a slot for accommodating the side enclosing plate 3, and a position limiting stand 41 engaging with the side enclosing plate 3 is provided in the slot, so that the connection strength of engagement is improved, the connection effect is good, the connection is stabler, and the assembly and disassembly are easy.

Figure 5:
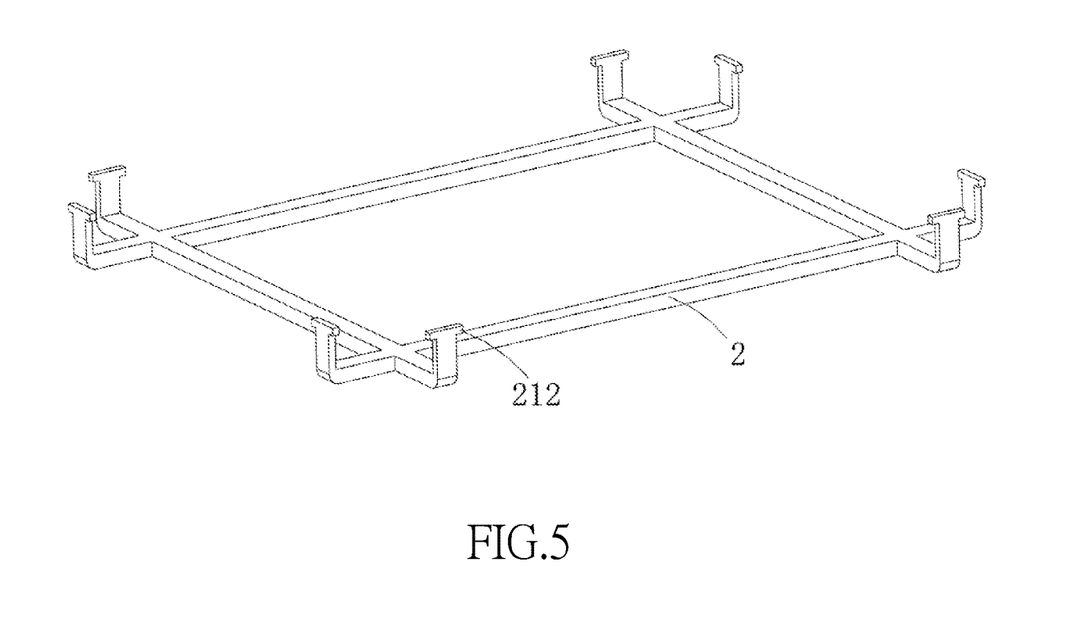
FIG. 5 is a second schematic view showing a three-dimensional structure of a frame used in the embodiment of this disclosure.

In one embodiment, referring to FIG. 5, as a specific aspect of the package structure of the disclosure, the fixing structure 21 includes a boss 212 disposed on the frame 2, and a slot engaging with the boss 212 is provided on the pad 4. Through the engagement of the boss 212 with the slot on the pad 4, the boss 212 is disposed on the end portion of the frame 2, is located on two sides of the frame 2 and is T-shaped, so that the engagement effect is good, and the connection strength between the pad 4 and the frame 2 can be ensured. In addition, the pad 4 and the frame 2 are detachably connected together, and can be easily disassembled. Different materials can be used to perform the separate processing followed by the assembling according to different positions of the package structure, thereby ensuring the packaging protection performance of the product and maximizing the reduction of the packaging costs.

Figure 6:
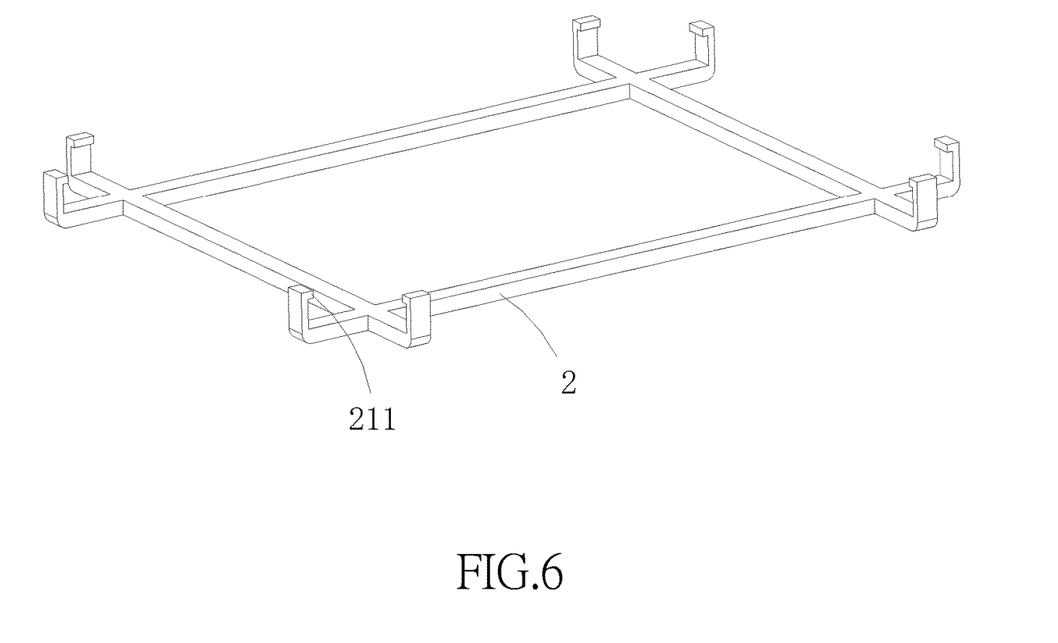
FIG. 6 is a third schematic view showing the three-dimensional structure of the frame used in the embodiment of this disclosure.
Figure 7:
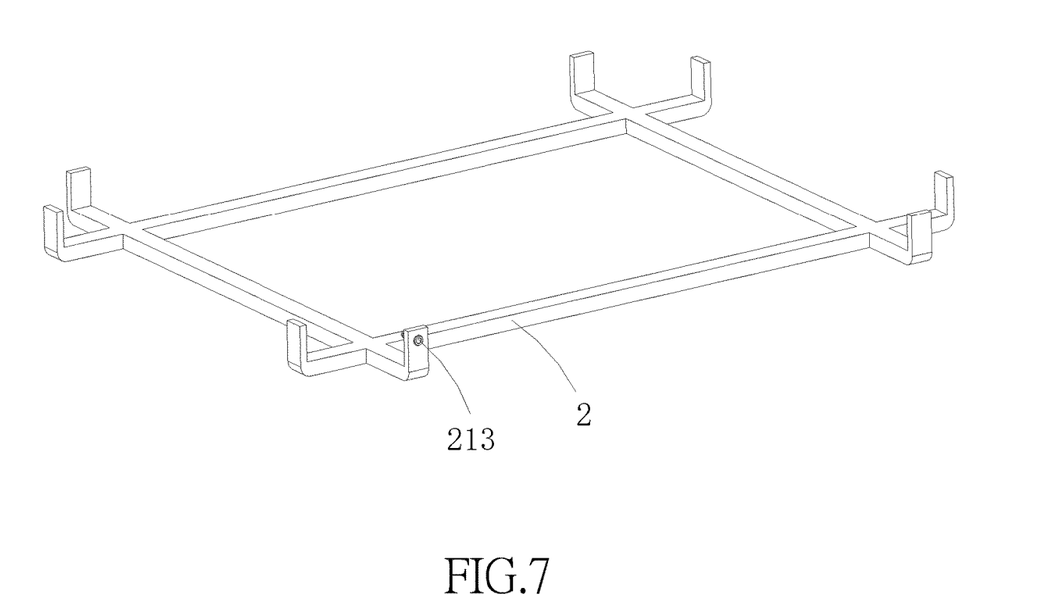
FIG. 7 is a fourth schematic view showing the three-dimensional structure of the frame used in the embodiment of this disclosure.

In one embodiment, referring to FIG. 6, as a specific aspect of the package structure of the disclosure, the fixing structure 21 includes a snap 211 disposed on the frame 2, wherein a slot snapping with the snap 211 is provided on the pad 4. The snap 211 snapping with the slot on the pad 4 can ensure the connection strength between the pad 4 and the frame 2. In addition, the pad 4 and the frame 2 are detachably connected together, and can be easily disassembled. Different materials can be used to perform the separate processing followed by assembling according to different positions of the package structure, thereby ensuring the packaging protection performance of the product and maximizing the reduction of the packaging costs.

In one embodiment, referring to FIGS. 7 to 12, as a specific aspect of the package structure of the disclosure, the fixing structure 21 is an expansion nail 213 for connecting the frame 2 to the pad 4, and the pad 4 is provided with a mounting slot for accommodating the expansion nail 213. By mounting the expansion nail 213 in the mounting slot, the frame 2 can be quickly connected to the pad 4 to ensure that a stable connection and an anti-loose effect are always maintained in the transporting process.

Figure 8:
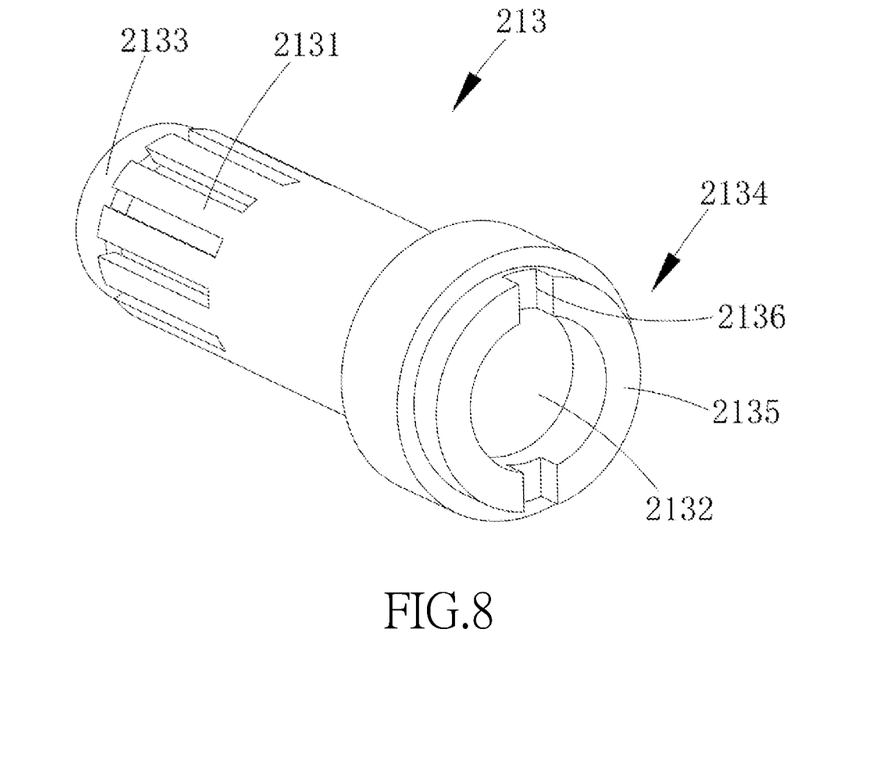
FIG. 8 is a first schematic view showing the three-dimensional structure of an expansion nail used in the embodiment of this disclosure.
Figure 9:
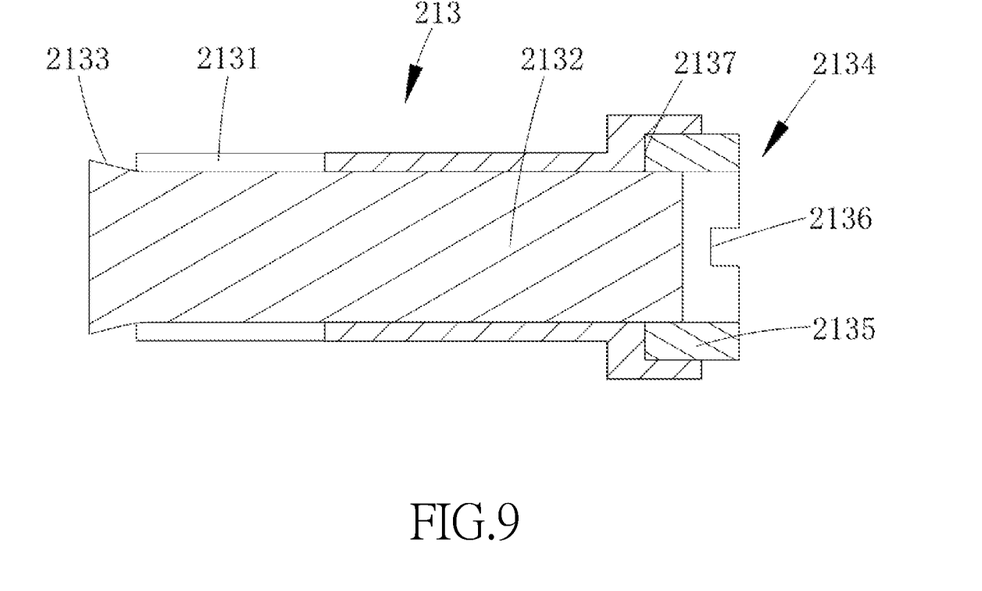
FIG. 9 is a main cross-sectional view of FIG. 8.

In one embodiment, referring to FIGS. 8 and 9, as a specific aspect of the package structure of the disclosure, the expansion nail 213 includes a sleeve 2131, a sliding bar 2132 disposed inside the sleeve 2131 and slidably fit with the sleeve 2131, and a driving unit 2134 for driving the sliding bar 2132 to slide along the axis of the sleeve 2131. The driving unit 2134 is disposed on one end of the sliding bar 2132, and a tapered boss 2133 for expanding the sleeve 2131 is disposed on the other end of the sliding bar 2132. The sliding bar 2132 can be pulled by the driving unit 2134 to slide in the sleeve 2131, the tapered boss 2133 squeezes the sleeve 2131, the expansion silk on the sleeve 2131 is spread, and the expansion nail 213 is firmly fixed to the pad 4. Because the pad 4 is a soft member, the expansion tube can be adopted for firm fixing. After the expansion silk is spread, it can pierce into the pad 4, so that a larger friction force is provided, the fixing effect is good, and the use is convenient.

In one embodiment, referring to FIGS. 8 and 9, as a specific aspect of the package structure of the disclosure, the driving unit 2134 includes a drive ring 2135 threadingly connected to the sliding bar 2132 and a restricting boss 2137 disposed on the end portion of the sleeve 2131 and resting against and fit with the drive ring 2135. Through the restricting boss 2137 resting against the drive ring 2135, the drive ring 2135 is threadingly fit with the sliding bar 2132, and the thread connection force can pull the sliding bar 2132 in the sleeve 2131, so that the operation is simple and convenient, and the use effect is good.

In one embodiment, referring to FIGS. 8 and 9, a drive slot 2136 is provided on the drive ring 2135. By the provision of the drive slot 2136, it is convenient to use the tool to perform a twisting operation on the drive ring 2135.

Figure 10:
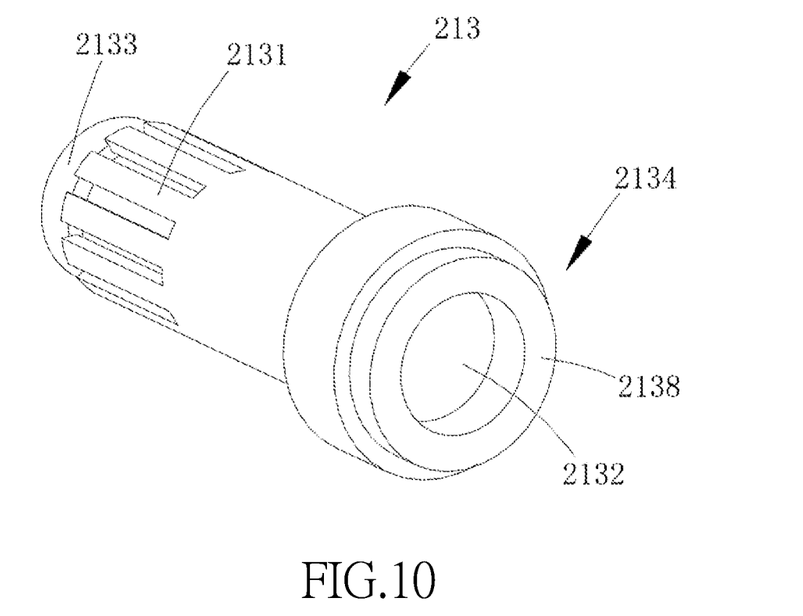
FIG. 10 is a second schematic view showing the three-dimensional structure of the expansion nail used in the embodiment of this disclosure.
Figure 11:
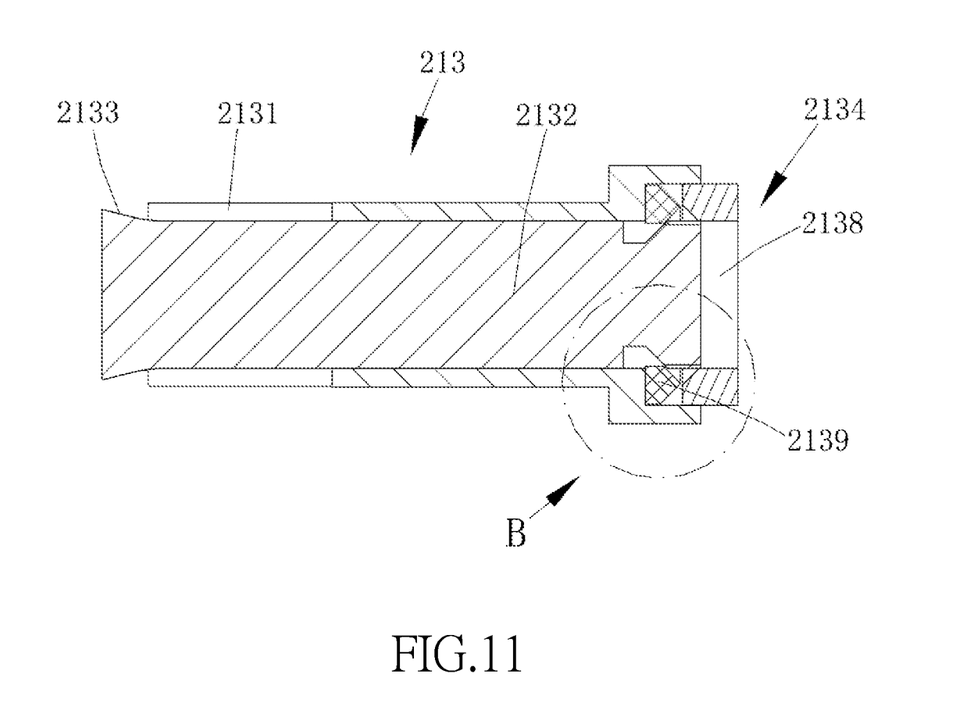
FIG. 11 is a main cross-sectional view of FIG. 10.
Figure 12:
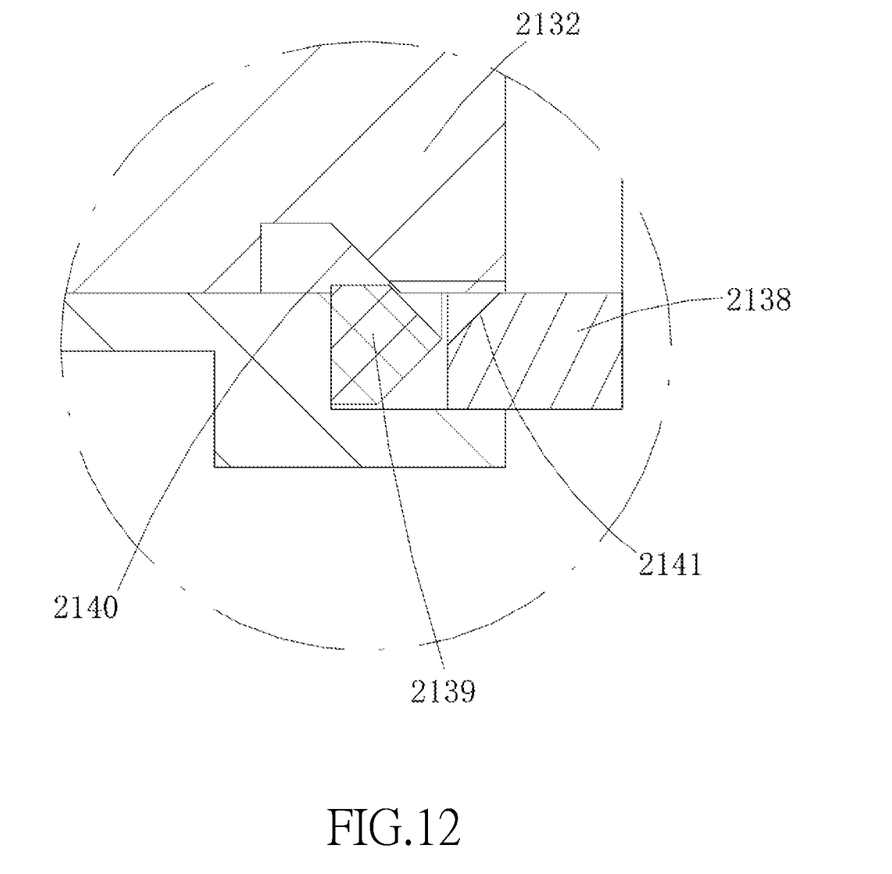
FIG. 12 is an enlarged schematic structure view showing a portion B in FIG. 11.

In one embodiment, referring to FIGS. 10 to 12, as a specific aspect of the package structure of the disclosure, the driving unit 2134 includes a first drive inclined surface 2140 disposed on the sliding bar 2132, a drive slider 2139 resting against the first drive inclined surface 2140, and a pressing ring 2138 for driving the drive slider 2139. A second drive inclined surface 2141 for the movement of the drive slider 2139 is disposed on the pressing ring 2138, and an accommodating slot for accommodating the drive slider 2139 and the pressing ring 2138 is formed on the end portion of the sleeve 2131. The drive slider 2139 rests against the first drive inclined surface 2140 and drives the sliding bar to slide. The pressing ring 2138 rests against the drive slider 2139, the pressing ring 2138 is slidably connected to a side surface of the accommodating slot, and the drive slider 2139 is slidably connected to a bottom surface of the accommodating slot. Through the second drive inclined surface 2141 on the pressing ring 2138 squeezing the drive slider 2139, a squeeze surface slidably fit with the second drive inclined surface 2141 is disposed on the drive slider 2139, after the squeeze surface is forced, the drive slider 2139 is moved in the axial direction of the sliding bar 2132, the drive slider 2139 squeezes the first drive inclined surface 2140 on the sliding bar 2132, and thus squeezes and drives the sliding bar 2132 to slide in the sleeve 2131. Through the tapered boss 2133 squeezing the sleeve 2131, the expansion silk on the sleeve 2131 is spread, and the expansion nail 213 is firmly fixed to the pad 4. Upon use, it is only necessary to press the drive ring 2135, and the use is easy and convenient.

This disclosure also provides a package structure for accommodating the target object 5. The package structure includes: the backing plate 1 for supporting the target object 5; the pad 4 disposed on the backing plate 1 and for fixing the target object 5; the frame 2 disposed on a lower side of the backing plate 1 and bonded to the backing plate 1 and for supporting the backing plate 1 to fix the pad 4 onto the backing plate 1; the side enclosing plate 3 disposed around the backing plate 1 and connected to the pad 4 to fix the pad 4; the magnetic component disposed on the backing plate 1 and attracting the magnetic coating on the target object 5; and the fixing structure 21 disposed on the end portion of the frame 2 and connected to fix the pad 4; wherein the fixing structure 21 includes a snap 211 disposed on the frame 2, and a slot snapping with the snap 211 is disposed on the pad 4.

In the package structure provided by this disclosure, the pads 4 are disposed at the corners of the backing plate 1 and for fixing the target object 5, the fixing is stable, the frame 2 is disposed on the lower side of the backing plate 1, not only the strength of the backing plate 1 can be improved, but also the pad 4 can be firmly fixed to the backing plate 1 to provide the buffer and support effects and ensure that the package structure in the transporting process cannot easily deform, has the high strength, and will not damage the internal target object 5. The side enclosing plate 3 is disposed around the backing plate 1 and for enclosing the circumference of the package structure, the side enclosing plate 3 is connected to the pad 4, the mounting strength of the pad 4 can be improved. The side enclosing plate 3, the backing plate 1 and the pad 4 and the frame 2 constitute a frame structure. The structural strength of the package structure can be improved. The magnetic material is coated on the target object 5. The magnetic component with the magnetic pole that attracts the magnetic material on the target object 5 is also correspondingly disposed on the bottom backing plate 1. After the target object 5 is placed in an aligned manner, the backing plate 1 and the target object 5 are fixed together through the magnetic attraction, so that the stability of the package structure in the transporting process can be greatly improved, and the problem that the target object 5 is damaged in the packaging and transporting processes can be effectively solved.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A package structure, comprising:
   a backing plate supporting a target object;
   at least one pad disposed on the backing plate and fixing the target object;
   a frame disposed on a lower side of the backing plate, bonded to the backing plate, and supporting the backing plate to fix the at least one pad onto the backing plate,
   wherein an end portion of the frame is provided with a fixing structure connected to the at least one pad to fix the at least one pad,
   wherein the fixing structure is an expansion nail for connecting the frame to the at least one pad, and the at least one pad is provided with a mounting slot for accommodating the expansion nail,
   wherein the expansion nail further comprises:
     a sleeve;
     a sliding bar disposed inside the sleeve and slidably fit with the sleeve; and
     a driving unit driving the sliding bar to slide along an axis of the sleeve;
     wherein the driving unit is disposed on one end of the sliding bar, and a tapered boss for expanding the sleeve is disposed on the other end of the sliding bar; and
   a side enclosing plate disposed around the backing plate and connected to the at least one pad to fix the at least one pad.

2. The package structure according to claim 1, wherein the driving unit comprises:
   a drive ring threadingly connected to the sliding bar; and
   a restricting boss disposed on an end portion of the sleeve and resting against and fit with the drive ring.

3. The package structure according to claim 1, wherein the driving unit comprises:
   a first drive inclined surface disposed on the sliding bar;
   a drive slider resting against the first drive inclined surface for driving the sliding bar to slide; and
   a pressing ring resting against the driving slider for driving the drive slider to slide;
   wherein a second drive inclined surface is disposed on the pressing ring for driving the drive slider to move, an accommodating slot is formed on an end portion of the sleeve for accommodating the drive slider and the pressing ring, the pressing ring is slidably connected to a side surface of the accommodating slot, and the drive slider is slidably connected to a bottom surface of the accommodating slot.

4. The package structure according to claim 1, wherein the side enclosing plate is inserted into and fixed to the at least one pad.

5. The package structure according to claim 1, wherein the frame is a metal frame.

* * * * *